(12) United States Patent
Kudo et al.

(10) Patent No.: US 8,760,168 B2
(45) Date of Patent: Jun. 24, 2014

(54) ASSEMBLED BATTERY TOTAL VOLTAGE DETECTION CIRCUIT

(75) Inventors: Akihiko Kudo, Hitachinaka (JP); Mutsumi Kikuchi, Mito (JP); Masaki Nagaoka, Kumagaya (JP)

(73) Assignees: Hitachi, Ltd., Tokyo (JP); Hitachi Vehicle Energy, Ltd., Hitachinaka-shi, Ibaraki ( * ) Notice: Subject to any disclaimer, the term of this patent is extended or adjusted under 35 U.S.C. 154(b) by 307 days.

(21) Appl. No.: 12/388,817

(22) Filed: Feb. 19, 2009

(65) Prior Publication Data
US 2009/0243621 A1 Oct. 1, 2009

(30) Foreign Application Priority Data
Mar. 27, 2008 (JP) ................................. 2008-083786

(51) Int. Cl.
*G01N 27/416* (2006.01)

(52) U.S. Cl.
USPC ......................................... 324/426; 320/116

(58) Field of Classification Search
USPC ......................................... 324/429, 433, 426
See application file for complete search history.

(56) References Cited

U.S. PATENT DOCUMENTS

| 6,362,627 B1 | 3/2002 | Shimamoto et al. |
| 2003/0094954 A1 | 5/2003 | Mashiko |
| 2003/0201959 A1 * | 10/2003 | Sakaguchi ........................ 345/87 |
| 2004/0051534 A1 | 3/2004 | Kobayashi et al. |
| 2004/0189330 A1 | 9/2004 | Herb et al. |
| 2007/0115005 A1 * | 5/2007 | Shimizu et al. .............. 324/549 |
| 2007/0285057 A1 * | 12/2007 | Yano ............................ 320/116 |

FOREIGN PATENT DOCUMENTS

| EP | 1 096 455 A1 | 5/2001 |
| EP | 1 275 969 A1 | 1/2003 |
| EP | 1 437 600 A1 | 7/2004 |
| EP | 1 898 227 A1 | 3/2008 |
| JP | 9-80106 A | 3/1997 |
| JP | 11-248756 A | 9/1999 |
| JP | 2001-124805 A | 5/2001 |
| JP | 2002-357624 A | 12/2002 |
| JP | 2004-219414 A | 8/2004 |

OTHER PUBLICATIONS

Extended European Search Report dated Jul. 7, 2009 (Nine (9) pages).
Japanese Office Action dated Aug. 31, 2010 with English translation (seven (7) pages.

* cited by examiner

*Primary Examiner* — Drew A Dunn
*Assistant Examiner* — Robert Grant
(74) *Attorney, Agent, or Firm* — Crowell & Moring LLP (57) ABSTRACT

An assembled battery total voltage detection circuit includes a main control circuit, a divider resistor connected between a plus terminal and a minus terminal of an assembled battery insulated from the main control circuit, and a differential amplifier circuit that amplifies voltage divided by the divider resistor. A constant electric potential relative to a ground of the main control circuit is applied to a midpoint of the divider resistor. The main control circuit measures the voltage divided by the divider resistor via the differential amplifier circuit.

17 Claims, 4 Drawing Sheets

ASSEMBLED BATTERY TOTAL VOLTAGE DETECTION CIRCUIT

INCORPORATION BY REFERENCE

The disclosure of the following priority application is herein incorporated by reference:

Japanese Patent Application No. 2008-83786 filed Mar. 27, 2008

BACKGROUND OF THE INVENTION

1. Field of the Invention

The present invention relates to an assembled battery total voltage detection circuit, in particular, an assembled battery total voltage detection circuit that measures voltage divided by a divider resistor connected between a plus (+) terminal and a minus (−) terminal.

2. Description of Related Art

A total voltage detection circuit with insulated input and output is conventionally used in, for example, an assembled battery for a pure electric vehicle or a hybrid electric vehicle. The insulation is required because a vehicle occupant otherwise may get a shock when high voltage shorts to a chassis ground of a vehicle. Therefore, in a pure electric vehicle or a hybrid electric vehicle, a main control circuit connected to the chassis ground of the vehicle and a circuit for a high voltage system are insulated from each other by high resistance.

Figure 2:
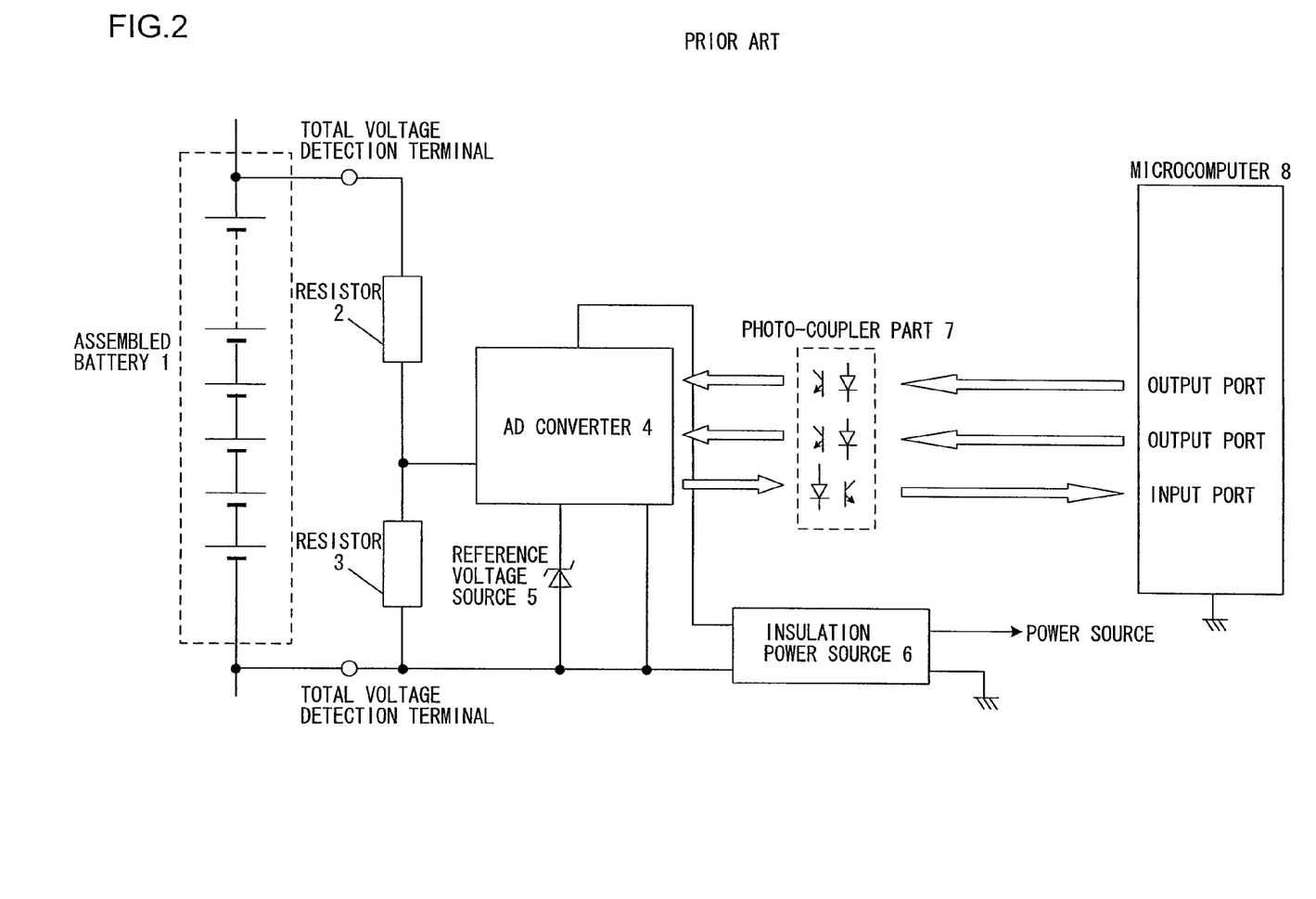
FIG. 2 is a circuit diagram of a conventional battery controller.

FIG. 2 shows an example of the total voltage detection circuit for an assembled battery. In the circuit in FIG. 2, a total voltage of an assembled battery 1 is divided to a low voltage by using resistors 2 and 3 so that the low voltage constitutes an input voltage into an A/D converter 4. The A/D converter 4 operates with an insulation power source 6 utilizing a reference voltage source 5 as a reference voltage. The A/D converter 4 is insulated via a photo-coupler portion 7. A microcomputer 8 performs operation control and data communication with a power source insulated from a high voltage system.

For an assembled battery total voltage detection circuit, Japanese Laid Open Patent Publication No. 2004-219414 discloses a technique in which a divider resistor constituted by a series circuit including a high resistor R1, a resistor Rm1, a resistor Rm2, and a high resistor R2 is connected between a plus terminal and a minus terminal of an assembled battery, and a voltage divided by the divider resistor is measured via a differential amplifier circuit, with a connection point (midpoint of the divider resistor) of the resistors Rm1 and Rm2 connected to a ground. Japanese Laid Open Patent Publication No. 2001-124805 discloses a technique for measurement through converting an assembled battery voltage to a current via a resistor and performing voltage-to-current conversion while insulating.

However, the conventional assembled battery total voltage detection circuit shown in FIG. 2 has a problem that an A/D converter is required besides a main control circuit which is constituted by an insulation power source, a microcomputer, and the like, thereby resulting in an increase in production costs. In the technique disclosed in the patent publications quoted above, high resistance is required to increase voltage divider ratio so as to divide voltage into one that an A/D converter can measure. In this case, current that flows through a total voltage detection terminal (connector) is reduced. Therefore, a costly gold-plated terminal is required so as to secure reliability of contact point of the total voltage detection terminal.

In view of these circumstances, the present invention intends to provide an assembled battery total voltage detection circuit, assuring high reliability and reduction in cost.

SUMMARY OF THE INVENTION

An assembled battery total voltage detection circuit according to a first aspect of the present invention includes a main control circuit, a divider resistor connected between a plus terminal and a minus terminal of an assembled battery insulated from the main control circuit, and a differential amplifier circuit that amplifies voltage divided by the divider resistor. In this assembled battery total voltage detection circuit, a constant electric potential relative to a ground of the main control circuit is applied to a midpoint of the divider resistor, and the main control circuit measures the voltage divided by the divider resistor via the differential amplifier circuit.

According to a second aspect of the present invention, in the assembled battery total voltage detection circuit according to the first aspect, the differential amplifier circuit may include a buffer and a differential amplifier.

According to a third aspect of the present invention, in the assembled battery total voltage detection circuit according to the second aspect, it is preferable that the buffer and the differential amplifier are each constituted by an operational amplifier that operates with a single power supply.

According to a fourth aspect of the present invention, the assembled battery total voltage detection circuit according to the first aspect may further include a buffer constituted by an operational amplifier that operates with a single power supply. In this assembled battery total voltage detection circuit, it is preferable that a positive constant electric potential is applied to the midpoint of the divider resistor with using the buffer.

According to a fifth aspect of the present invention, in the assembled battery total voltage detection circuit according to the third of fourth aspect, it is desirable that a plurality of the operational amplifiers are packed into a single package.

According to a sixth aspect of the present invention, the assembled battery total voltage detection circuit according to the first aspect may further include a resister of which a resistance value is smaller than that of the divider resistor, the resister being connected in parallel to the divider resistor.

According to a seventh aspect of the present invention, the assembled battery total voltage detection circuit according to the sixth aspect may further include two switching elements, one of which is inserted between the plus terminal of the assembled battery and the divider resistor, the other of which is inserted between the minus terminal of the assembled battery and the divider resistor. In this assembled battery total voltage detection circuit, it is preferable that, at a time of measuring a total voltage of the assembled battery, the main control circuit controls the switching elements to be ON and measures the voltage divided by the divider resistor via the differential amplifier circuit.

According to an eighth aspect of the present invention, in the assembled battery total voltage detection circuit according to the first aspect, the main control circuit may include a first failure detection unit that performs failure detection for the differential amplifier circuit.

According to a ninth aspect of the present invention, in the assembled battery total voltage detection circuit according to the fourth aspect, the main control circuit may include a second failure detection unit that performs failure detection for the buffer.

An assembled battery total voltage detection circuit according to a tenth aspect of the present invention includes a main control circuit, a divider resistor connected between a plus terminal and a minus terminal of an assembled battery insulated from the main control circuit, the divider resister being constituted by a series circuit consisting of first, second, third and fourth resistors, and a differential amplifier circuit including a positive phase input terminal which is connected to a connection point of the first and second resistors, and a negative phase input terminal which is connected to a connection point of the third and fourth resistors. In this assembled battery total voltage detection circuit, a constant electric potential relative to a ground of the main control circuit is applied to a connection point of the second and third resistors, and the main control circuit measures output voltage of the differential amplifier circuit.

According to an eleventh aspect of the present invention, in the assembled battery total voltage detection circuit according to the tenth aspect, the differential amplifier circuit may include a buffer and a differential amplifier.

According to a twelfth aspect of the present invention, in the assembled battery total voltage detection circuit according to the eleventh aspect, it is desirable that the differential amplifier circuit includes a first buffer and a second buffer, the connection point of the first and second resistors is connected to an input terminal of the first buffer, the connection point of the third and fourth resistors is connected to an input terminal of the second buffer, and output terminals of the first and second buffers are connected to the positive phase input terminal and the negative phase input terminal of the differential amplifier, respectively.

According to a thirteenth aspect of the present invention, in the assembled battery total voltage detection circuit according to the twelfth aspect, it is preferable that the first and second buffers and the differential amplifier are each constituted by an operational amplifier that operates with a single power supply.

According to a fourteenth aspect of the present invention, the assembled battery total voltage detection circuit according to the tenth aspect may further include a buffer constituted by an operational amplifier that operates with a single power supply. In this assembled battery total voltage detection circuit, it is desirable that a positive constant electric potential is applied to the connection point of the second and third resistors with using the buffer.

According to a fifteenth aspect of the present invention, in the assembled battery total voltage detection circuit according to the thirteenth or fourteenth aspect, it is preferable that a plurality of the operational amplifiers are packed into a single package.

According to a sixteenth aspect of the present invention, the assembled battery total voltage detection circuit according to the tenth aspect may further include a first and a second switching elements, the first switching element being inserted between the plus terminal of the assembled battery and the first resistor, the second switching element being inserted between the minus terminal of the assembled battery and the fourth resistor, and a resister of which a resistance value is smaller than that of a sum of the first, second, third and fourth resistors, the resister being connected in parallel between a connection point at which the first switching element and the first resistor are connected, and a connection point at which the second switching element and the fourth resistor are connected. In this assembled battery total voltage detection circuit, it is preferable that, at a time of measuring a total voltage of the assembled battery, the main control circuit controls the first and second switching elements to be ON and measures voltage between the connection point of the first and second resistors and the connection point of the third and fourth resistors via the differential amplifier circuit.

An assembled battery total voltage detection circuit according to a seventeenth aspect of the present invention includes a main control circuit, a divider resistor connected between a plus terminal and a minus terminal of an assembled battery insulated from the main control circuit, the divider resistor being constituted by a series circuit consisting of first, second, third and fourth resistors, a differential amplifier circuit including a positive phase input terminal which is connected to a connection point of the first and second resistors, and a negative phase input terminal which is connected to a connection point of the third and fourth resistors, and a buffer constituted by an operational amplifier that operates with a single power supply. In this assembled battery total voltage detection circuit, it is desirable that a constant electric potential relative to a ground of the main control circuit is applied to a connection point of the second and third resistors with using the buffer, and the main control circuit measures output voltage of the differential amplifier circuit so as to measure a total voltage of the assembled battery, and includes a first failure detection unit that performs failure detection for the differential amplifier circuit.

According to an eighteenth aspect of the present invention, in the assembled battery total voltage detection circuit according to the seventeenth aspect, the first failure detection unit may detect input voltage values to a positive phase input side and a negative phase input side of the differential amplifier circuit and an output voltage value from an output side of the differential amplifier circuit, and, if a value obtained by "(the output voltage value of the differential amplifier circuit)/{(the input voltage value to the positive phase input side)–(the input voltage value to the negative phase input side)}" is outside a range of a predetermined amplification factor of the differential amplifier circuit, it is preferable that the first failure detection unit judges the differential amplifier circuit to be at fault.

According to a nineteenth aspect of the present invention, in the assembled battery total voltage detection circuit according to the seventeenth aspect, the main control circuit may further include a second failure detection unit that performs failure detection for the buffer.

According to a twentieth aspect of the present invention, in the assembled battery total voltage detection circuit according to the nineteenth aspect, the second failure detection unit may detect an output voltage value of the buffer, and, if the detected output voltage value is outside a predetermined range, it is preferable that the second failure detection unit judges the buffer to be at fault.

DESCRIPTION OF PREFERRED EMBODIMENTS

An embodiment of an assembled battery total voltage detection circuit according to the present invention applied to a battery controller mounted on a hybrid electric vehicle will now be described with reference to the drawings.

(Configuration)

Figure 1:
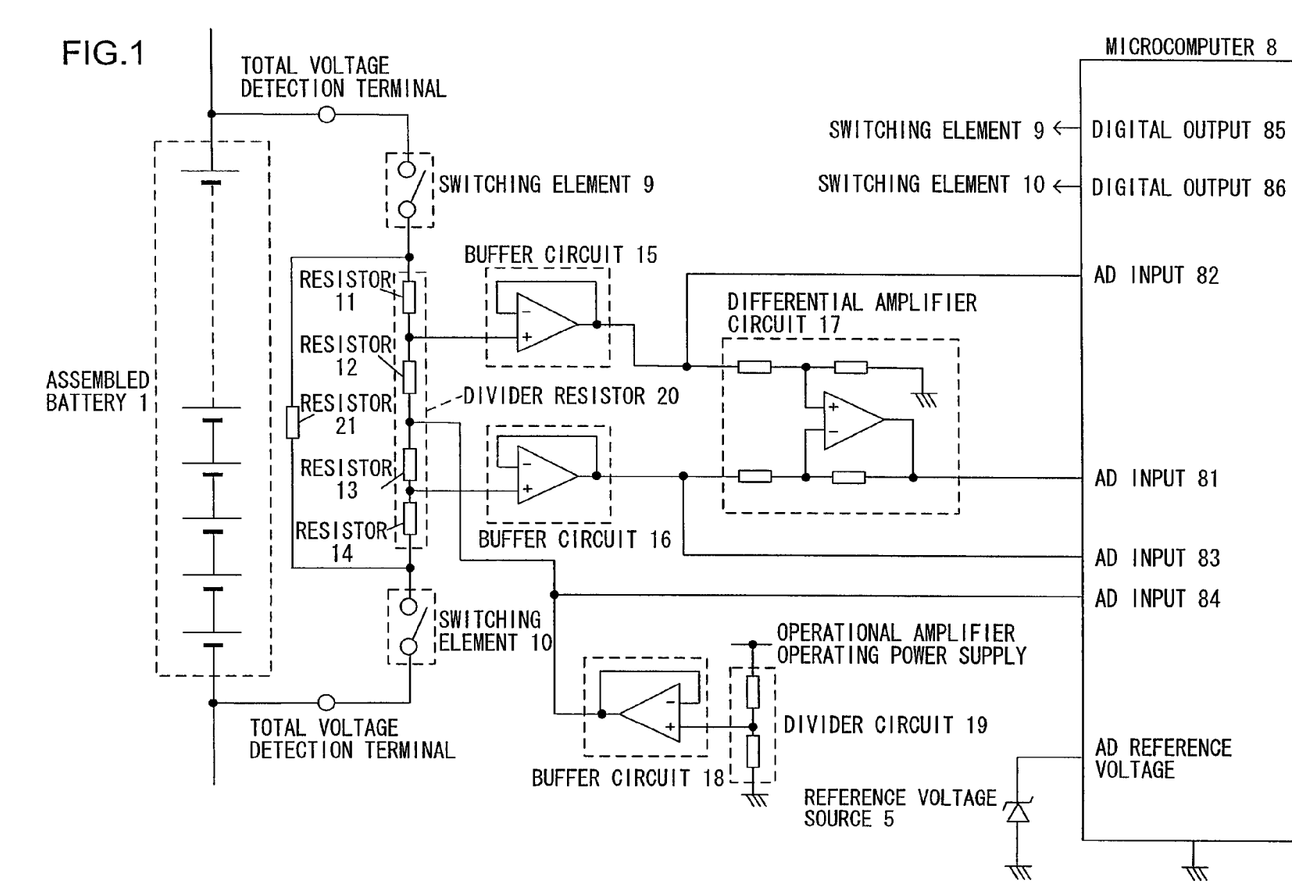
FIG. 1 is a circuit diagram of a battery controller according to an embodiment to which the present invention can be applied.

As shown in FIG. 1, a battery controller according to the present embodiment includes a divider resistor 20 constituted by four resistors and connected in parallel to an assembled battery 1, a differential amplifier constituted by buffer circuits 15 and 16 and a differential amplifier circuit 17, a buffer circuit 18 which applies a positive constant electric potential to the midpoint of the divider resistor 20, and a microcomputer 8 as a main control circuit.

The assembled battery 1 according to the present embodiment is constituted by 96 lithium ion batteries with voltage rating of 3.6V connected in series. The total voltage rating of the assembled battery 1 is 345.6V. Specifically, a plurality of lithium ion batteries (for example, four batteries) are grouped into one group battery. A plurality of group batteries are connected in series in a battery case. This assures vibration resistance required for in-vehicle use and assures handleability and assemblability in production.

The plus (+) terminal and the minus (−) terminal of the assembled battery 1 are each connected to a tinned total voltage detection terminal (connector). The total voltage detection terminals are each connected to a connector on the battery controller side. That is, the assembled battery 1 is connected via the total voltage detection terminals to a series circuit that includes a switching element 9 composed of an FET or the like, the divider resistor 20 constituted by resistors 11, 12, 13, and 14 connected in series, and a switching element 10 composed of an FET or the like.

The resistors 11 and 14 are high-resistance (in the present embodiment, 10 MΩ each). The total voltage of the assembled battery 1 is divided into low voltages. The resistors 12 and 13 are resistors for voltage measurement (and voltage division), each of which is set to 50 kΩ in the present embodiment. Therefore, the assembled battery 1 and the battery controller are insulated from each other with insulation resistance of 5 MΩ. Division ratio between the resistors 11 and 12 as well as between the resistors 14 and 13 is both 50/10.05. Therefore, voltage of 0.86V is generated on both ends of the resistors 12 and 13 when the total voltage of the assembled battery 1 is 345.6V.

One end of a resistor 21 is connected to a connection point of the switching element 9 and the resistor 11. The other end of the resistor 21 is connected to a connection point of the resistor 14 and the switching element 10. In other words, the resistor 21 is connected in parallel to the divider resistor 20. The resistor 21 increases current that flows through the total voltage detection terminal at the time of measuring the total voltage of the assembled battery 1. The resistor 21 is set to 200 kΩ in the present embodiment.

Gates of the switching element 9 and the switching element 10 are respectively connected to digital output terminals 85 and 86 of the microcomputer 8. A binary high level signal is output from the microcomputer 8 to the gates of the switching elements 9 and 10 at the time of measuring the total voltage of the assembled battery 1, so as to control the switching elements 9 and 10 to be ON.

Output of the buffer circuit 18, which is operated by a single power supply, is connected to a connection point of the resistor 12 and the resistor 13, and a positive constant electric potential is applied thereto. In other words, the midpoint of the divider resistor 20, which is constituted by the resistors 11 to 14, is positively-biased. In the present embodiment, the voltage is a value of an operating power supply of an operational amplifier divided by a divider circuit 19, which is constituted by two resistors. The voltage of the operating power supply is 5V. The voltage after the division (output voltage of the buffer circuit 18) is set to 2.5V.

A connection point of the resistor 11 and the resistor 12 is connected to a positive phase input side of the differential amplifier circuit 17 via the buffer circuit 15. In other words, this connection point is connected to a positive phase input terminal of the differential amplifier via the resistor. A connection point of the resistor 13 and the resistor 14 is connected to a negative phase input side of the differential amplifier circuit 17 via the buffer circuit 16. In other words, this connection point is connected to a negative phase input terminal of the differential amplifier via the resistor. The output of the differential amplifier circuit 17 is connected to an A/D input terminal 81 of the microcomputer 8, which utilizes the reference voltage source 5 as a reference voltage. The microcomputer 8 measures (detects) the total voltage of the assembled battery 1. It should be noted that operational amplifiers used for the buffer circuits 15 and 16 and the differential amplifier circuit 17 are also operated by a single power supply. Therefore, a total of four operational amplifiers including the operational amplifier for the buffer circuit 18 are packed in a single package.

According to the present embodiment, voltage of the reference voltage source 5 is 5V. An amplification factor of the differential amplifier circuit 17 is set to double. A doubled value of the difference between input voltages to the positive phase input side and the negative phase input side of the differential amplifier circuit 17 is applied to the A/D input terminal 81 of the microcomputer 8. When the total voltage of the assembled battery 1 is 345.6V, the input voltage to the positive phase input terminal is the sum (3.36V) of the voltage at the connection point of the resistors 11 and 12 (2.5V) and the voltage at the both ends of the resistor 12 (0.86V), while the input voltage to the negative phase input terminal is the difference (1.64V) between the voltage at the connection point of the resistors 11 and 12 (2.5V) and the voltage at the both ends of the resistor 13 (0.86V). Since the amplification factor of the differential amplifier circuit 17 is set to double, the voltage at the A/D input terminal 81 of the microcomputer 8 is 3.36V. An A/D converter that utilizes the reference voltage source 5 as a reference voltage is incorporated into the microcomputer 8. An analog voltage input through the A/D input terminal 81 is converted to a digital voltage by the A/D converter and taken in to a CPU of the microcomputer 8. The microcomputer 8 is connected to the ground which is equipotential with a chassis of the hybrid electric vehicle.

Figure 3:
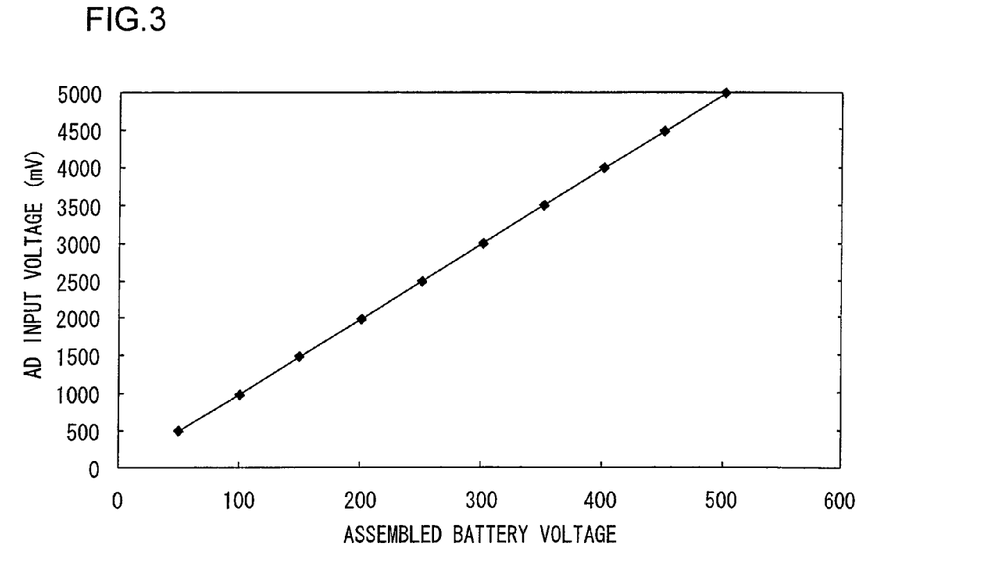
FIG. 3 is a characteristic diagram showing detection result of a voltage which is input to an AD input terminal of a microcomputer, with varying an assembled battery voltage.

FIG. 3 shows detection result of a voltage which is input to the A/D input terminal 81 of the microcomputer 8, with varying a voltage of the assembled battery 1. As shown in FIG. 3, when the total voltage of the assembled battery 1 is varied from 50V to 500V, a voltage is actually applied to the A/D input terminal 81 as calculated. In other words, the total voltage of the assembled battery 1 and the voltage of the A/D input terminal 81 are in a linear relationship.

As described above, the operational amplifier is operated by a single power supply. Specifically, the operational amplifier is operated when the input voltage ranges from 0V to a power supply voltage. According to the present embodiment, ½ of an operating power supply voltage is a voltage at the connection point of the resistors 12 and 13. Therefore, even if the electric potential of the battery controller (the microcomputer 8) to the ground fluctuates to some extent, the total voltage of the assembled battery 1 can normally be measured within the range of the operating voltage of the operational amplifier.

Figure 4:
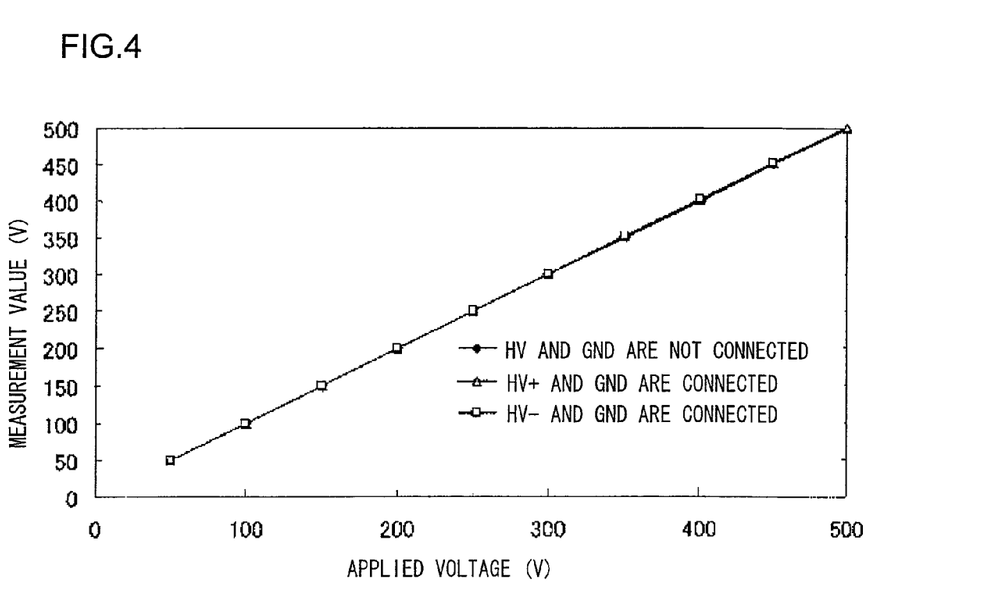
FIG. 4 is a characteristic diagram showing a total voltage detection characteristics when a plus (+) terminal of the assembled battery is connected to a ground and when a minus (−) terminal of the assembled battery is connected to the ground.

As an example, FIG. 4 shows the total voltage detection characteristics when the plus (+) terminal of the assembled battery 1 is connected to the ground and when the minus (−) terminal of the assembled battery 1 is connected to the ground. As shown in FIG. 4, the total voltage of the assembled battery 1 is normally detected even if either one of the terminals of the assembled battery 1 is connected to the ground. In a real system such as a hybrid electric vehicle, it is often the case that an inverter and a motor are used as load of an assembled battery. Therefore, a certain amount of noise is superimposed on the total voltage detection terminal of the assembled battery 1 to the ground, thereby fluctuating the electric potential. However, in the present embodiment, the total voltage can be normally measured even if the total voltage detection terminal of the assembled battery 1 fluctuates to the ground potential.

As shown in FIG. 1, an output terminal of the buffer circuit 15 (the positive phase input side of the differential amplifier circuit 17) is connected to an A/D input terminal 82 of the microcomputer 8. An output terminal of the buffer circuit 16 (the negative phase input side of the differential amplifier circuit 17) is connected to an A/D input terminal 83 of the microcomputer 8. An output terminal of the buffer circuit 18 (the connection point of the resistors 12 and 13, that is, the midpoint of the divider resistor 20) is connected to an A/D input terminal 84 of the microcomputer 8. As in the case of the A/D input terminal 81, another three A/D converters which utilizes the reference voltage source 5 as a reference voltage are incorporated into the microcomputer 8. Analog voltages input through the A/D input terminals 82 to 84 are each converted to a digital voltage by one of the three A/D converters and taken in to the CPU of the microcomputer 8.

Two digital output ports are incorporated in the microcomputer 8. A binary signal at high level or low level is output through each of the digital output ports to the digital output terminals 85 and 86. The microcomputer 8 includes an interface for a communication with a higher-level control device that controls an engine or the like of the hybrid electric vehicle. The microcomputer 8 informs the higher-level control device of the total voltage of the assembled battery 1 upon an instruction from the higher-level control device or at a predetermined time interval.

(Performance)

Performance of the battery controller according to the present embodiment will now be described mainly with reference to the CPU of the microcomputer 8.

<Measurement of the Total Voltage of the Assembled Battery>

The CPU controls the switching elements 9 and 10 to be ON with the digital output terminals 85 and 86 at high level and takes in a digital voltage value of the A/D converter connected to the A/D input terminal 81, so as to measure the total voltage of the assembled battery 1 at a predetermined time interval (for example, every 5 to 20 ms). While the vehicle is traveling and before traveling, the CPU informs at a predetermined time interval the higher-level control device of the total voltage value of the assembled battery 1 that has been measured. Based upon the total voltage value of the assembled battery 1 which has been informed, the higher-level control device performs motor torque calculation or the like so as to control the inverter that drives the motor or so as to control the engine.

When the vehicle operation is finished, the CPU stops measuring the total voltage of the assembled battery 1 and controls the switching elements 9 and 10 to be OFF with the digital output terminals 85 and 86 at low level.

<Failure Detection>

The CPU detects at a predetermined time interval (5 ms to 20 ms) failures in: (1) the differential amplifier circuit 17, and (2) a bias potential output circuit (the buffer circuit 18 and the divider circuit 19).

The CPU detects (measures) via the A/D converter which is incorporated therein input voltage values to the positive phase input side and the negative phase input side of the differential amplifier circuit 17 (output voltages of the buffer circuits 15 and 16) and an output voltage value of the differential amplifier circuit 17. The CPU calculates the value of "(output voltage value of the differential amplifier circuit 17)/{ (input voltage value to the positive phase input side)−(input voltage value to the negative phase input side)}". The CPU then judges whether or not the obtained value is within a range of a predetermined amplification factor of the differential amplifier circuit 17 (in the present example, double). In case of the affirmative judgment (inside the range), the CPU judges the differential amplifier circuit 17 to be working normally. In case of the negative judgment (outside the range), the CPU judges the differential amplifier circuit 17 to be at fault.

The CPU detects (measures) via the A/D converter which is incorporated therein an output voltage of the buffer circuit 18 and then judges whether or not the output voltage is within a predetermined range (for example, less than 2.0V). In case of the affirmative judgment (inside the range), the CPU judges the bias potential output circuit to be working normally. In case of the negative judgment (outside the range), the CPU judges the bias potential output circuit (particularly, the buffer circuit 18) to be at fault.

As described above, the CPU detects every 5 ms to 20 ms failures in: (1) the differential amplifier circuit 17, and (2) the bias potential output circuit. It should be noted that the CPU does not draw a conclusion from a single failure detection. If the CPU does judge a plurality of failures consecutively, for example, within 100 ms, the CPU informs the higher-level control device that: (1) the differential amplifier circuit 17 is at fault, or (2) the bias potential output circuit is at fault. Upon being informed, the higher-level control device displays that information on an instrument panel or, if necessary, gives a voice warning, so as to alert the driver.

(Advantageous Effects, Etc.)

Advantageous effects, etc. of the battery controller according to the present embodiment will now be described.

The battery controller according to the present embodiment includes the divider resistor 20, which is provided between the plus (+) terminal and the minus (−) terminal of the assembled battery 1. The divider resistor 20 is constituted by the series circuit that consists of the resistors 11, 12, 13, and 14. The connection point of the resistors 11 and 12 is connected to the positive phase input side of the differential amplifier circuit 17 via the buffer circuit 15. The connection point of the resistors 13 and 14 is connected to the negative phase input side of the differential amplifier circuit 17 via the buffer circuit 16. The constant electric potential (2.5V) relative to the ground of the microcomputer 8 is applied to the connection point of the resistors 12 and 13 (the midpoint of the divider resistor 20) so as to measure output voltage of the differential amplifier circuit 17. Therefore, without an insulation power source, the total voltage of an assembled battery can be detected by using the A/D converter incorporated in the microcomputer 8, thereby reducing production cost. Furthermore, a reference source of the A/D converter can be shared with the reference voltage source 5 of the microcomputer 8. This eliminates the need of a special reference voltage source for an assembled battery total voltage detection circuit, and significantly reduces both the production cost and the number of components in comparison with conventional techniques.

The connection point of the resistors 11 and 12 is connected to the positive phase input side of the differential amplifier circuit 17 via the buffer 15. The connection point of the resistors 13 and 14 is connected to the negative phase input side of the differential amplifier circuit 17 via the buffer 16. This removes an error in measuring the total voltage of the assembled battery 1 even if input impedance to the differential amplifier circuit 17 is low. Therefore, there is no need to provide the buffers 15 and 16 if input impedance to the differential amplifier circuit 17 is sufficiently high, more particularly, if the differential amplifier circuit 17 incorporates the buffer circuits 15 and 16 therein. However, it should be noted that a differential amplifier circuit with a buffer incorporated therein tends to be costly at the moment.

General-purpose operational amplifiers operated by a single power supply are used for the buffer circuits 15 and 16, the differential amplifier circuit 17, and the buffer circuit 18 so as to reduce production cost. More specifically, these four general-purpose operational amplifiers are packed into a single package, thereby further reducing production cost.

A positive constant electric potential (2.5V) is applied to the midpoint of the divider resistor 20, that is, the connection point of the resistors 12 and 13 through the buffer 18. Therefore, impedance of the connection point of the resistors 12 and 13 to the ground can be reduced, thereby assuring noise-resistant, stable performance. It should be noted that a hybrid electric vehicle requires reliability of a battery controller to noise generated by an inverter or a motor.

Furthermore, the resistor 21 is connected in parallel to the divider resistor 20. The resistor 21 has a resistance value of 200 kΩ, which is smaller than that of the divider resistor. If the resistor 21 is not connected in parallel, when the total voltage of the assembled battery 1 is 345.6V, a current as small as 17 μA flows through the total voltage detection terminal. Therefore, a costly gold-plated contact has to be used so as to assure reliability of contact point of the total voltage detection terminal. On the other hand, if the resistor 21 is connected in parallel, a current as large as 1.7 mA flows through the total voltage detection terminal. Therefore, even if a less-costly tinned contact or the like is used as in the present embodiment, reliability of contact point of the total voltage detection terminal is assured.

The switching elements 9 and 10 are controlled to be ON at the time of measuring the total voltage of the assembled battery 1. This prevents electric discharge from the assembled battery 1 considerably, at times other than measuring the total voltage (in particular, while the hybrid electric vehicle is stopping).

The battery controller according to the present embodiment automatically detects failures in: (1) the differential amplifier circuit 17, and (2) the bias potential output circuit. Therefore, safety and reliability are secured even on a moving vehicle such as a hybrid electric vehicle.

Figure 5:
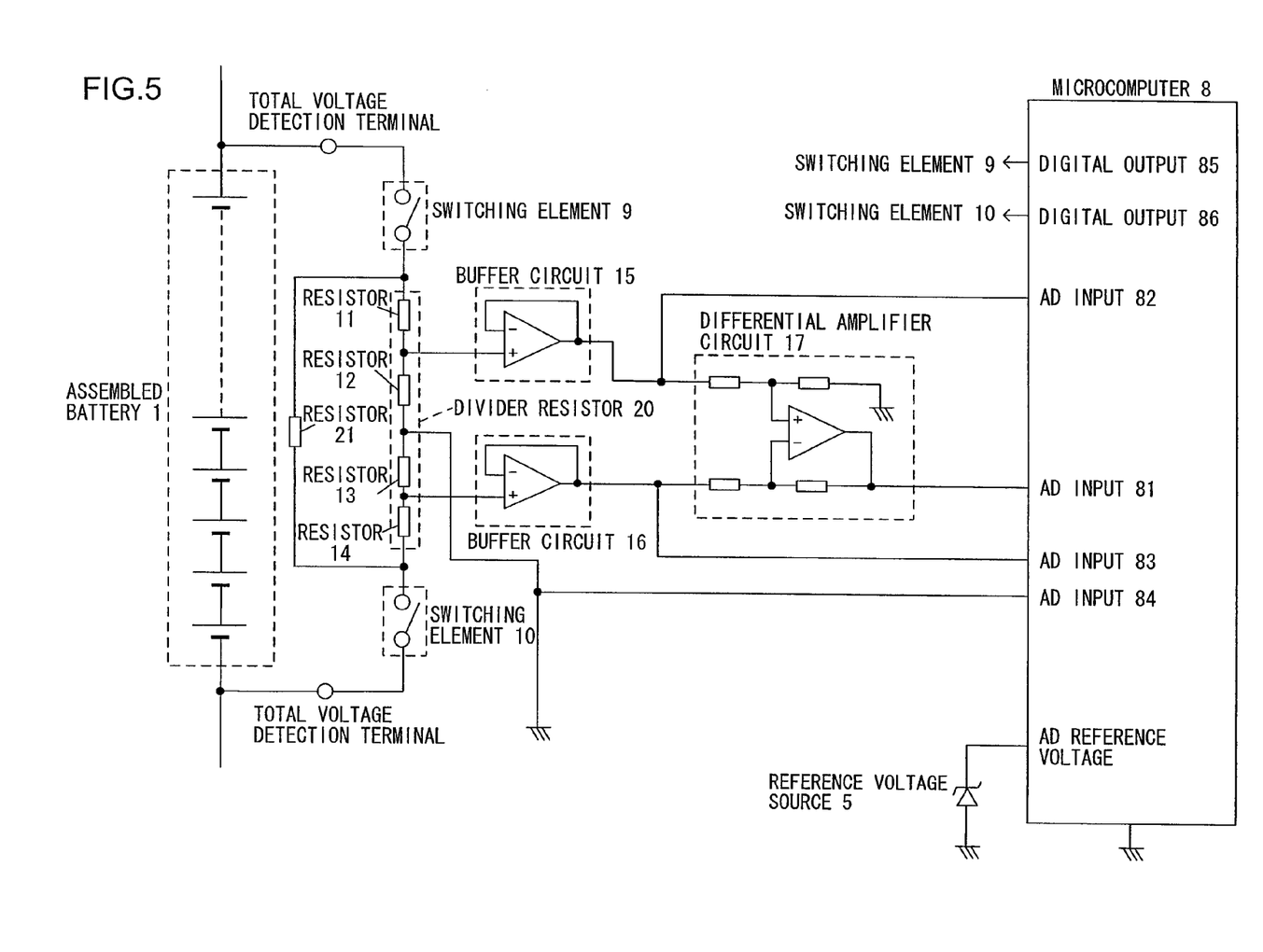
FIG. 5 is a circuit diagram of a battery controller according to another embodiment.

While the operational amplifier operated by a single power supply is used in the example according to the present embodiment, an operational amplifier operated by positive and negative power supplies may be used so as to allow voltage at the connection point of the resistors 12 and 13 to be the ground potential. FIG. 5 is a circuit diagram thereof, showing an example in which the buffer circuit 18 and the divider circuit 19 are removed from the circuit shown in FIG. 1 and the connection point of the resistors 12 and 13 is connected to the ground. A battery controller according to another embodiment as the one described above has advantageous effects as the battery controller shown in FIG. 1 has.

Accordingly, the present invention includes the assembled battery total voltage detection circuits as following.

(a) an assembled battery total voltage detection circuit in which a divider resistor constituted by a series circuit consisting of first, second, third and fourth resistors is connected between a plus (+) terminal and a minus (−) terminal of an assembled battery insulated from a main control circuit, a connection point of the first and second resistors is connected to a positive phase input side of a differential amplifier circuit, a connection point of the third and fourth resistors is connected to a negative phase input side of the differential amplifier circuit, and a connection point of the second and third resistors is connected to the ground, so as to measure an output voltage of the differential amplifier circuit (b) an assembled battery total voltage detection circuit as described in (a) in which the differential amplifier circuit includes a buffer and an differential amplifier (c) an assembled battery total voltage detection circuit as described in (b) in which the connection point of the first and second resistors is connected to an input terminal of a first buffer, the connection point of the third and fourth resistors is connected to an input terminal of a second buffer, and output terminals of the first and second buffers are connected to the positive phase input side and the negative phase input side of the differential amplifier, respectively (d) an assembled battery total voltage detection circuit as described in (c) in which the first and second buffers and the differential amplifier are each constituted by an operational amplifier that operates with positive and negative power supplies While the microcomputer 8 is used as a main control circuit in the example according to the present embodiment, the present invention is not limited to the above example. The present invention may be configured using a hardware including, for instance, an input-output circuit and a logic circuit.

While the assembled battery total voltage detection circuit is applied to the battery controller mounted on the hybrid electric vehicle (a moving vehicle) in the example according to the present embodiment, the present invention is not limited to the above example. The present invention may be applied to, for instance, a stationary power storage system. The power storage system may store an electric power generated by solar power or wind power. While lithium ion batteries are used for a battery that constitutes an assembled battery in the example according to the present embodiment, the present invention is not limited to the above example. For instance, a nickel-metal hybrid battery or the like may be used.

Since the present invention provides an assembled battery total voltage detection circuit with reliability at a low cost, it contributes to manufacturing and marketing of an assembled battery total voltage detection circuit, therefore it has industrial applicability.

According to the present invention, a constant electric potential relative to the ground of the main control circuit is applied to the midpoint of the divider resistor which is connected between the plus (+) terminal and the minus (−) terminal of the assembled battery, and the voltage divided by the divider resistor is measured via the differential amplifier circuit. Therefore, the total voltage of the assembled battery can be detected without a costly insulation power source, and impedance of the midpoint of the divider resistor to the ground can be reduced, thereby assuring reliability related to noise-resistance.

What is claimed is:

1. An assembled battery total voltage detection circuit for detecting a total voltage of an assembled battery configured by connecting a plurality of batteries, comprising:
   a main control circuit that includes an A/D converter operating with a positive single power supply;
   a divider resistor connected between a plus terminal and a minus terminal of the assembled battery insulated from the main control circuit;
   a differential amplifier circuit, including a first buffer, a second buffer and a differential amplifier, that amplifies voltage divided by the divider resistor and that outputs the amplified voltage to the A/D converter, the first buffer, the second buffer and the differential amplifier each being constituted by an operational amplifier operating with a positive single power supply; and
   a third buffer for applying a bias voltage to the midpoint of the divider resistor, the third buffer being constituted by an operational amplifier that operates with a positive single power supply, wherein
   the bias voltage is a positive constant electric potential relative to a ground of the main control circuit and is set based upon an operating voltage of the operational amplifier;
   the amplified voltage output from the differential amplifier circuit and input to the A/D converter varies within a range of the operating voltage of the operational amplifier; and
   the main control circuit:
      inputs the voltage divided by the divider resistor, the midpoint of which is biased to the positive electric potential by the third buffer, to the A/D converter via the differential amplifier circuit, and measures the total voltage of the assembled battery; and
      inputs output voltages of the first and second buffers and the bias voltage to the A/D converter, measures the output voltages of the first and second buffers and the bias voltage, and performs fault diagnosis of the assembled battery total voltage detection circuit based upon the measured total voltage, the measured output voltages of the first and second buffers and the measured bias voltage.

2. An assembled battery total voltage detection circuit according to claim 1, wherein
   a plurality of operational amplifiers packed in a single package are used for the first buffer, the second buffer, the third buffer and the differential amplifier.

3. An assembled battery total voltage detection circuit according to claim 1, further comprising
   a resistor of which a resistance value is smaller than that of the divider resistor, the resistor being connected in parallel to the divider resistor.

4. An assembled battery total voltage detection circuit according to claim 1, further comprising
   two switching elements, one of which is inserted between the plus terminal of the assembled battery and the divider resistor, the other of which is inserted between the minus terminal of the assembled battery and the divider resistor, wherein,
   at a time of measuring the total voltage of the assembled battery, the main control circuit controls the switching elements to be ON, inputs the voltage divided by the divider resistor, the midpoint of which is biased to the positive electric potential by the third buffer, to the A/D converter via the differential amplifier circuit, and measures the total voltage of the assembled battery.

5. An assembled battery total voltage detection circuit according to claim 1, wherein
   the main control circuit includes a first failure detection unit that performs failure detection for the differential amplifier circuit based upon whether or not a ratio of the measured total voltage to the difference between the measured output voltages of the first and second buffers is within a predetermined range.

6. An assembled battery total voltage detection circuit according to claim 1, wherein
   the main control circuit includes a second failure detection unit that performs failure detection for the third buffer based upon whether or not the measured bias voltage is within a predetermined range.

7. An assembled battery total voltage detection circuit according to claim 5, wherein
   the main control circuit includes a second failure detection unit that performs failure detection for the third buffer based upon whether or not the measured bias voltage is within a predetermined range.

8. An assembled battery total voltage detection circuit for detecting a total voltage of an assembled battery configured by connecting a plurality of batteries, comprising:
   a main control circuit that includes an A/D converter operating with a positive single power supply;
   a divider resistor connected between a plus terminal and a minus terminal of the assembled battery insulated from the main control circuit, the divider resistor being constituted by a series circuit consisting of first, second, third and fourth resistors;
   a differential amplifier circuit that includes a first buffer, a second buffer and a differential amplifier, that amplifies voltage divided by the divider resistor and that outputs the amplified voltage to the A/D converter, the first buffer, the second buffer and the differential amplifier each being constituted by an operational amplifier operating with a positive single power supply; and
   a third buffer for applying a bias voltage to a connection point of the second and third resistors, the third buffer being constituted by an operational amplifier that operates with a positive single power supply, wherein
   a connection point of the first and second resistors is connected to a positive phase input side of the differential amplifier;
   a connection point of the third and fourth resistors is connected to a negative phase input side of the differential amplifier;
   the bias voltage is a positive constant electric potential relative to a ground of the main control circuit and is set based upon an operating voltage of the operational amplifier;
   the amplified voltage output from the differential amplifier circuit and input to the A/D converter varies within a range of the operating voltage of the operational amplifier; and
   the main control circuit:
      inputs voltage between the connection point of the first and second resistors and the connection point of the third and fourth resistors of the divider resistor, the connection point of the second and third resistors of which is biased to the positive electric potential by the third buffer, to the A/D converter via the differential amplifier circuit, and measures the total voltage of the assembled battery; and inputs output voltages of the first and second buffers and the bias voltage to the A/D converter, measures the output voltages of the first and second buffers and the bias voltage, and performs fault diagnosis of the assembled battery total voltage detection circuit based upon the measured total voltage, the measured output voltages of the first and second buffers and the measured bias voltage.

9. An assembled battery total voltage detection circuit according to claim 8, wherein:

the connection point of the first and second resistors is connected to an input terminal of the first buffer;

the connection point of the third and fourth resistors is connected to an input terminal of the second buffer;

output terminal of the first buffer is connected to the positive phase input terminal of the differential amplifier; and, output terminal of the second buffer is connected to the negative phase input terminal of the differential amplifier.

10. An assembled battery total voltage detection circuit according to claim 8, wherein a plurality of operational amplifiers packed in a single package are used for the first buffer, the second buffer, the third buffer and the differential amplifier.

11. An assembled battery total voltage detection circuit according to claim 8, further comprising:

a first and a second switching elements, the first switching element being inserted between the plus terminal of the assembled battery and the first resistor, the second switching element being inserted between the minus terminal of the assembled battery and the fourth resistor; and a resistor of which a resistance value is smaller than that of a sum of the first, second, third and fourth resistors, the resistor being connected in parallel between a connection point at which the first switching element and the first resistor are connected, and a connection point at which the second switching element and the fourth resistor are connected, wherein, at a time of measuring the total voltage of the assembled battery, the main control circuit controls the first and second switching elements to be ON, inputs the voltage between the connection point of the first and second resistors and the connection point of the third and fourth resistors, the connection point of the second and third resistors of which is biased to the positive electric potential by the third buffer, to the A/D converter via the differential amplifier circuit, and measures the total voltage of the assembled battery.

12. An assembled battery total voltage detection circuit according to claim 8, wherein the main control circuit further includes a second failure detection unit that performs failure detection for the third buffer based upon whether or not the measured bias voltage is within a predetermined range.

13. An assembled battery total voltage detection circuit according to claim 12, wherein if the measured bias voltage is outside the predetermined range, the second failure detection unit judges the third buffer to be at fault.

14. An assembled battery total voltage detection circuit according to claim 8, wherein the main control circuit includes a first failure detection unit that performs failure detection for the differential amplifier circuit based upon whether or not a ratio of the measured total voltage to the difference between the measured output voltages of the first and second buffers is within a predetermined range.

15. An assembled battery total voltage detection circuit according to claim 14, wherein if a value obtained by "(the measured total voltage)/{(the measured output voltage of the first buffer)−(the measured output voltage of the second buffer)}" is outside a range of a predetermined amplification factor of the differential amplifier circuit, the first failure detection unit judges the differential amplifier circuit to be at fault.

16. An assembled battery total voltage detection circuit according to claim 14, wherein the main control circuit further includes a second failure detection unit that performs failure detection for the third buffer based upon whether or not the measured bias voltage is within a predetermined range.

17. An assembled battery total voltage detection circuit according to claim 16, wherein if the measured bias voltage is outside the predetermined range, the second failure detection unit judges the third buffer to be at fault.

* * * * *